United States Patent
Maassen et al.

(10) Patent No.: US 12,243,768 B2
(45) Date of Patent: Mar. 4, 2025

(54) SUBSTRATE HOLDER FOR USE IN A LITHOGRAPHIC APPARATUS AND A DEVICE MANUFACTURING METHOD

(71) Applicant: ASML NETHERLANDS B.V., Veldhoven (NL)

(72) Inventors: Johannes Josephus Maassen, Waalre (NL); André Schreuder, Eindhoven (NL); Herman Marquart, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 847 days.

(21) Appl. No.: 17/421,085

(22) PCT Filed: Dec. 13, 2019

(86) PCT No.: PCT/EP2019/085167
§ 371 (c)(1),
(2) Date: Jul. 7, 2021

(87) PCT Pub. No.: WO2020/151878
PCT Pub. Date: Jul. 30, 2020

(65) Prior Publication Data
US 2022/0115260 A1    Apr. 14, 2022

(30) Foreign Application Priority Data
Jan. 23, 2019    (EP) .................................... 19153181

(51) Int. Cl.
*H01L 21/687* (2006.01)
*G03F 7/00* (2006.01)
(52) U.S. Cl.
CPC ...... *H01L 21/6875* (2013.01); *G03F 7/70783* (2013.01); *G03F 7/70825* (2013.01)

(58) Field of Classification Search
CPC .. G03F 7/707; G03F 7/70783; G03F 7/70825; H01L 21/6875
See application file for complete search history.

(56) References Cited

U.S. PATENT DOCUMENTS

| 10,120,292 B2 | 11/2018 | Lafarre et al. |
| 10,245,641 B2 | 4/2019 | Lafarre et al. |
| (Continued) | | |

FOREIGN PATENT DOCUMENTS

| JP | 2002343853 | 11/2002 |
| JP | 2005-142566 | 6/2005 |
| (Continued) | | |

OTHER PUBLICATIONS

Notice of Reasons for Refusal dated Apr. 5, 2024, issued in corresponding Japanese Patent Application No. 2023069734 A with English translation (29 pgs.).

(Continued)

*Primary Examiner* — Deoram Persaud
(74) *Attorney, Agent, or Firm* — Pillsbury Winthrop Shaw Pittman, LLP

(57) ABSTRACT

A substrate holder including: a main body having a main body surface; a plurality of burls projecting from the main body surface and configured for supporting the substrate; and an edge seal projecting from the main body surface, wherein: the edge seal is spaced apart from the plurality of burls so as to define a gap therebetween, the gap having a width greater than or equal to about 75% of a pitch of the plurality of burls; the plurality of burls includes a first group of burls and a second group of burls surrounding the first group of burls; and the stiffness in the direction perpendicular to the support plane per unit area of the second group of burls is greater than or equal to about 150% of the stiffness (Continued)

in the direction perpendicular to the support plane per unit area of the first group of burls.

20 Claims, 5 Drawing Sheets

(56) References Cited

U.S. PATENT DOCUMENTS

| | | | |
|---|---|---|---|
| 10,324,382 B2 | 6/2019 | Kunnen et al. | |
| 10,453,734 B2 | 10/2019 | Poiesz et al. | |
| 10,514,615 B2 | 12/2019 | Jeunink et al. | |
| 10,719,019 B2 | 7/2020 | Poiesz et al. | |
| 10,895,808 B2 | 1/2021 | Nakiboglu et al. | |
| 2003/0001103 A1* | 1/2003 | Kobayashi | H01L 21/6835 269/21 |
| 2005/0248746 A1 | 11/2005 | Zaal et al. | |
| 2006/0244276 A1 | 11/2006 | Heo | |
| 2008/0068580 A1 | 3/2008 | Mori et al. | |
| 2012/0274920 A1 | 11/2012 | Bex et al. | |
| 2013/0094005 A1* | 4/2013 | Kunnen | G03F 7/70716 355/30 |
| 2015/0380294 A1 | 12/2015 | Entegris | |
| 2016/0187791 A1 | 6/2016 | Houben et al. | |
| 2018/0149983 A1 | 5/2018 | Soethoudt et al. | |
| 2018/0166314 A1* | 6/2018 | Ellis | H01L 21/6875 |
| 2018/0190534 A1* | 7/2018 | Poiesz | H01L 21/0274 |
| 2018/0259855 A1 | 9/2018 | Roset et al. | |
| 2018/0286738 A1* | 10/2018 | Valefi | H01L 21/6838 |
| 2018/0308740 A1* | 10/2018 | Achanta | H01L 21/6831 |
| 2019/0043749 A1* | 2/2019 | Jeunink | G03F 7/707 |
| 2020/0292947 A1* | 9/2020 | Poiesz | G03F 7/70716 |
| 2020/0326635 A1* | 10/2020 | Soethoudt | G03F 7/707 |
| 2023/0384694 A1* | 11/2023 | Alikhan | G03F 7/7095 |

FOREIGN PATENT DOCUMENTS

| | | |
|---|---|---|
| JP | 2015-065327 | 4/2015 |
| JP | 2016-139649 | 8/2016 |
| JP | 2016-187046 | 10/2016 |
| JP | 2016537663 | 12/2016 |
| JP | 2018518701 | 7/2018 |
| JP | 2018-521344 A | 8/2018 |
| JP | 2018529995 | 10/2018 |
| KR | 20020041591 | 6/2002 |
| KR | 10-2007-0118783 | 12/2007 |
| TW | 201709401 | 3/2017 |
| TW | I574124 | 3/2017 |
| TW | 201803011 | 1/2018 |
| TW | I618185 | 3/2018 |

OTHER PUBLICATIONS

"Outer burls with a higher stiffness in Z-direction than inner burls", Research Disclosure, vol. 624, No. 17, p. 253 (Apr. 2016).
Japanese Office Action issued in corresponding Japanese Patent Application No. 2021-528221, dated Sep. 16, 2022.
International Search Report and Written Opinion issued in corresponding PCT Patent Application No. PCT/EP2019/085167, dated Mar. 13, 2020.

* cited by examiner

SUBSTRATE HOLDER FOR USE IN A LITHOGRAPHIC APPARATUS AND A DEVICE MANUFACTURING METHOD

CROSS-REFERENCE TO RELATED APPLICATIONS

This application is the U.S. national phase entry of PCT Patent Application No. PCT/EP2019/085167 which was filed on Dec. 13, 2019, which is based upon and claims the benefit of priority of European Patent Application No. 19153181.3 which was filed on Jan. 23, 2019, each of which is incorporated herein in its entirety by reference.

FIELD

The present invention relates to substrate holders for use in a lithographic apparatus and to device manufacturing methods.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as "Moore's law". To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

In a lithographic apparatus the substrate to be exposed (which may be referred to as a production substrate) is held on a substrate holder (sometimes referred to as a wafer table). The substrate holder may be moveable with respect to the projection system. The substrate holder usually comprises a solid body made of a rigid material and having similar dimensions in plan to the production substrate to be supported. The substrate-facing surface of the solid body is provided with a plurality of projections (referred to as burls). The distal surfaces of the burls conform to a flat plane and support the substrate. The burls provide several advantages: a contaminant particle on the substrate holder or on the substrate is likely to fall between burls and therefore does not cause a deformation of the substrate; it is easier to machine the burls so their ends conform to a plane than to make the surface of the solid body flat; and the properties of the burls can be adjusted, e.g. to control the clamping of the substrate.

Production substrates may become distorted during the process of manufacturing devices, especially when structures with significant height, e.g. so-called 3D-NAND, are formed. Often substrates may become "bowl-shaped", i.e. are concave viewed from above, or "umbrella-shaped", i.e. convex viewed from above. For the purposed of the present disclosure the surface on which device structures are formed is referred to as the top surface. In this context, "height" is measured in the direction perpendicular to the nominal surface of the substrate, which direction may be referred to as the Z-direction. Bowl-shaped and umbrella-shaped substrates are, to a certain degree, flattened out when clamped onto a substrate holder, e.g. by partially evacuating the space between the substrate and substrate holder. However, if the amount of distortion, which is typically measured by the height difference between the lowest point on the surface of the substrate and the highest point on the surface of the substrate, is too great, various problems can arise. In particular, it may be difficult to clamp the substrate adequately, there may be excessive wear of the burls during loading and unloading of substrates and the residual height variation in the surface of the substrate may be too great to enable correct patterning on all parts of the substrate, especially close to the edges.

SUMMARY

An object of the present invention is to provide a substrate holder that enables effective pattern formation on substrates having a high degree of distortion.

In an embodiment of the present invention there is provided A substrate holder for use in a lithographic apparatus and configured to support a substrate, the substrate holder comprising:
  a main body having a main body surface;
  a plurality of burls projecting from the main body surface and each having a distal end surface which substantially conforms to a support plane and is configured for supporting the substrate; and
  an edge seal projecting from the main body surface and extending around the plurality of burls so as to restrict gas flow when a substrate is held by the substrate holder; wherein:
  the edge seal is spaced apart from the plurality of burls so as to define a gap between the edge seals and the plurality of burls, the gap having a gap width that is greater than or equal to about 75% of a pitch of the plurality of burls;
  the plurality of burls comprises a first group of burls and a second group of burls, the second group of burls surrounding the first group of burls; and
  wherein the stiffness in the direction perpendicular to the support plane per unit area of the second group of burls is greater than or equal to about 150% of the stiffness in the direction perpendicular to the support plane per unit area of the first group of burls.

An embodiment of the invention also provides device manufacturing method comprising:
  holding a substrate on a substrate holder as described above by reducing the pressure between the main body surface and the substrate; and
  applying a pattern to the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the present document, the terms "radiation" and "beam" are used to encompass all types of electromagnetic radiation, including ultraviolet radiation (e.g. with a wavelength of 436, 405, 365, 248, 193, 157, 126 or 13.5 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
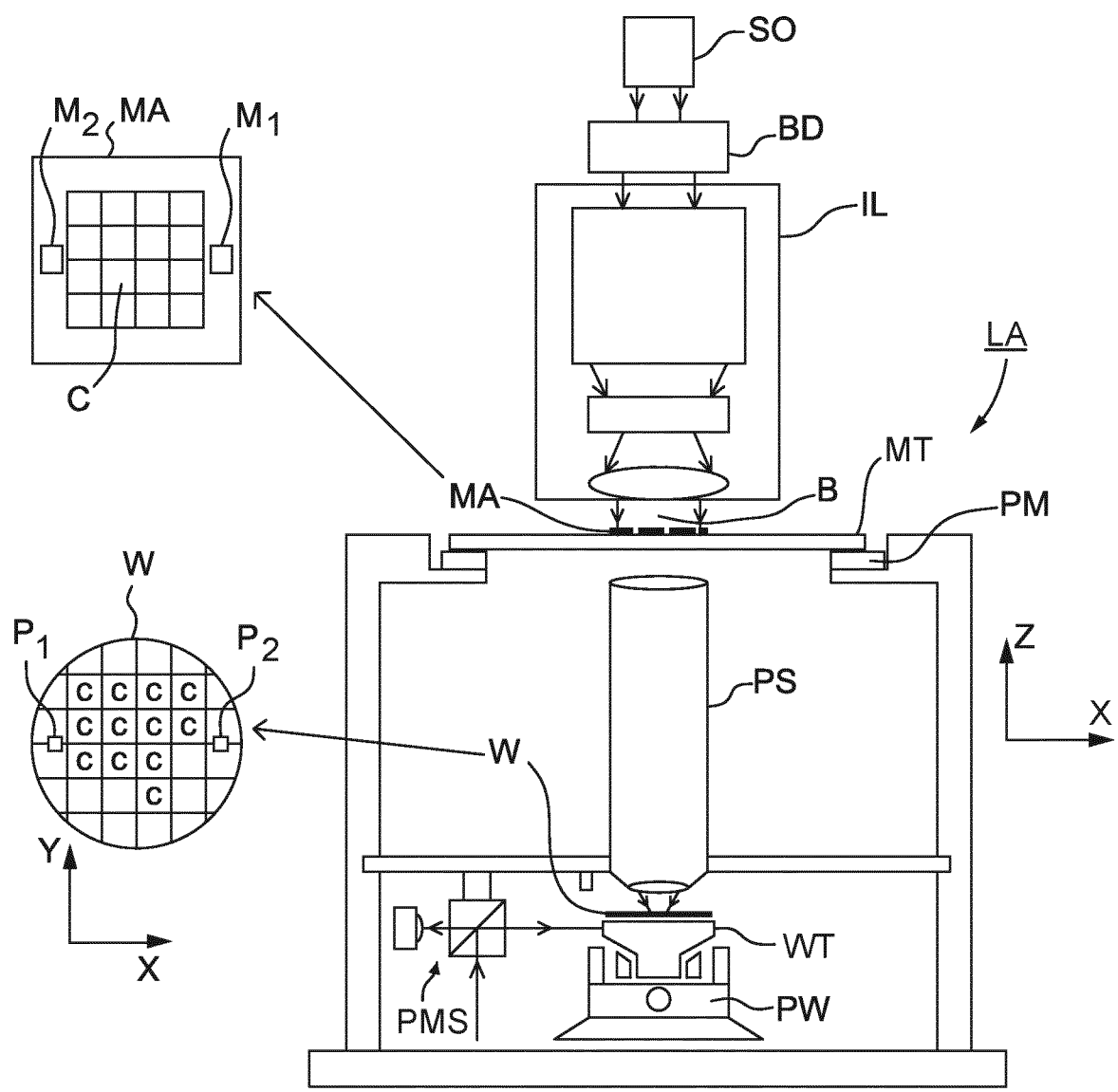
FIG. 1 schematically depicts a lithographic apparatus.

FIG. 1 schematically depicts a lithographic apparatus LA. The lithographic apparatus includes an illumination system (also referred to as illuminator) IL configured to condition a radiation beam B (e.g., EUV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate holder) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate W may be covered by an immersion liquid having a relatively high refractive index, e.g., water, so as to fill an immersion space between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in FIG. 1). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In this specification, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In a lithographic apparatus it is necessary to position with great accuracy the upper surface of a substrate to be exposed in the plane of best focus of the aerial image of the pattern projected by the projection system. To achieve this, the substrate is held on a substrate holder. The surface of the substrate holder that supports the substrate is provided with a plurality of burls whose distal ends are coplanar in a nominal support plane. The burls, though numerous, are small in cross-sectional area parallel to the support plane so that the total cross-sectional area of their distal ends is a few percent, e.g. less than 5%, of the surface area of the substrate. The burls are commonly conical in shape but need not be. The gas pressure in the space between the substrate holder and the substrate is reduced relative to the pressure above the substrate to create a force clamping the substrate to the substrate holder. Alternatively, the substrate holder is provided with a number of electrodes that can clamp conducting substrate using electrostatic pressure.

The burls serve several purposes. For example, if a contaminant particle is present on the substrate holder or the substrate, it is probable that it is not located at the location of the burl and therefore does not distort the substrate. In addition, it is easier to manufacture the burls so that their distal ends conform accurately to a flat plane than to manufacture a large area with very low flatness. Also, the properties of the burls can be varied, e.g. by the application of coatings or varying the dimensions of the burls.

Figure 2:
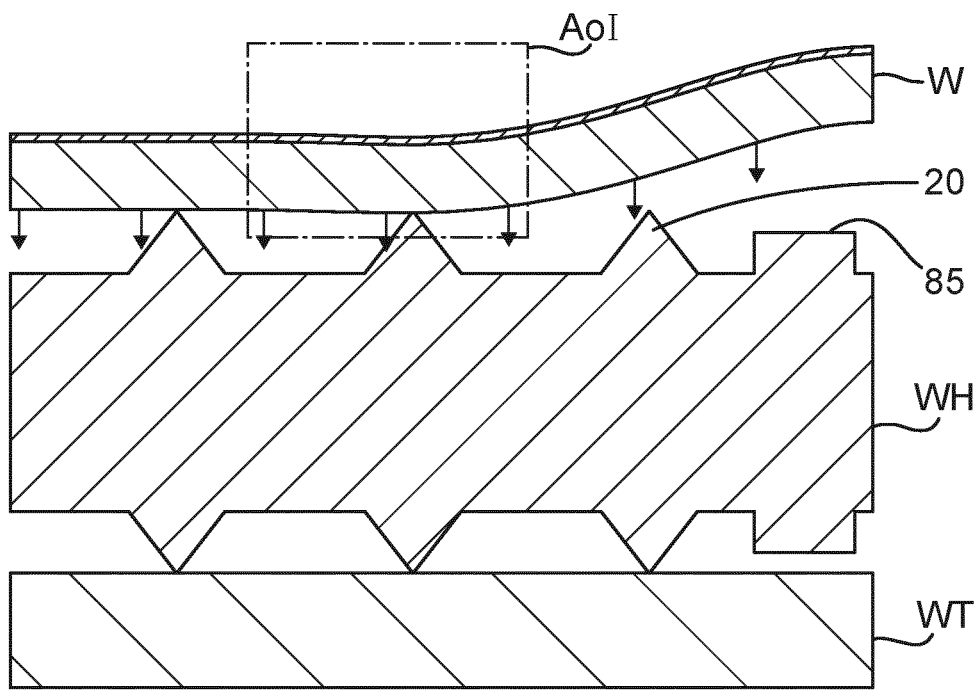
FIG. 2 depicts part of a conventional substrate holder clamping a bowl-shaped substrate.
Figure 3:
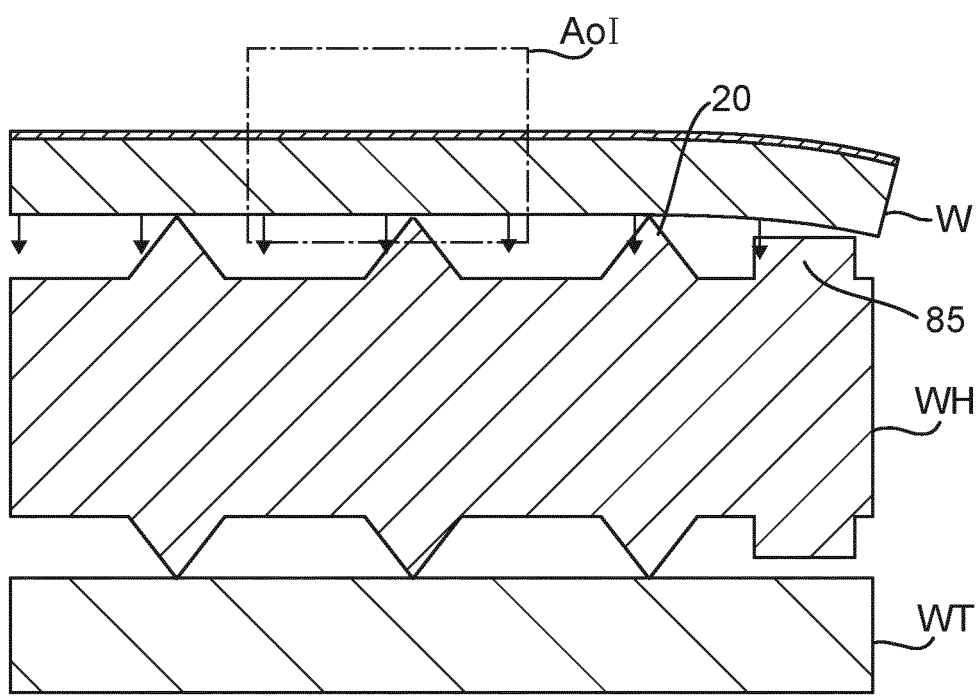
FIG. 3 depicts part of a conventional substrate holder clamping an umbrella-shaped substrate.

FIGS. 2 and 3 depict in cross-section the situation at the edge of a conventional substrate holder WH when clamping a bowl-shaped and an umbrella-shaped substrate W respectively. It should be noted that the distortion of the substrates W is greatly exaggerated in FIGS. 2 and 3 for the purposes of explanation. When manufacturing devices it is desirable to manufacture as many devices as possible per substrate, which means it is desirable to image as close to the edge of the substrate W as possible. In many cases it is desirable to form patterns as close as a few mm, e.g. 3 mm or less, from the edge of the substrate W. Thus, the performance of the substrate holder WH can be judged by considering the shape of the surface of a clamped substrate W in an area of interest AoI encompassing the most outward position where a pattern is to be formed. In particular, the performance of the substrate holder WH can be judged on the basis of the maximum difference in height relative to the average height of the substrate W.

Comparing FIGS. 2 and 3, it can be seen that when a bowl-shaped substrate is clamped the edges of the substrate W may fail to contact the outermost burl 20. Edge seal 85, which may also be referred to as the vacuum edge seal, reduces the flow of gas into the space below the substrate W when that space is evacuated to provide a pressure differential to clamp the substrate W. Even if the amount of distortion in the unclamped (unstressed) substrates is similar, the distortion in the area of interest AoI when clamped is higher for the bowl-shaped substrate than for the umbrella-shaped substrate. Thus it is desirable to provide a substrate holder that can provide improved performance in clamping bowl-shaped substrates, but desirably with little or no detriment to the performance in clamping umbrella-shaped substrates.

To address at least some of the disadvantages of the prior art, an embodiment of the invention provides a substrate holder WH in which a gap is provided between the burls and the edge seal 85. The gap is free of burls and other projections that reach the support plane and has a width that is at least 75% of the pitch of the burls. The burls are divided into two groups, a first group and a second group which surrounds the first group. The second group is therefore those burls 20b which are closest to the edge seal 85. The second group of burls 20b are configured so that the total vertical stiffness (i.e. stiffness in the direction perpendicular to the support plane) in a given area is at least 150% of the total stiffness of the burls 20a of the first group in as comparable area of the same size.

Experiments and simulations demonstrate that a substrate holder WH constructed as above can provide a better performance when clamping bowl-shaped substrates without unacceptable detriment to the performance when clamping umbrella-shaped substrates. By increasing the gap between the outermost burls 20b and the vacuum edge seal 85, e.g. by positioning the vacuum edge seal 85 closer to the edge of the substrate holder WH, a greater force is exerted on the outer part of the substrate W, so that bowl-shaped substrates are flattened more. The force resisted by each of the outermost burls 20b is, as a consequence, increased and so the stiffness of the outermost burls 20b is increased to compensate. Thus the outermost burls 20b (the second group) are not compressed excessively.

When a bowl-shaped substrate is clamped, the very edge of it is unsupported so that the outer part of the substrate W forms a cantilever off the outermost burl 20b. When an umbrella-shaped substrate is clamped, the force exerted on the outermost burls 20b is also increased and this could lead to greater compression of the outermost burls 20b but the increased stiffness of the outermost burls 20b counteracts this effect. Therefore performance of the substrate holder WH with umbrella-shaped burls is not adversely affected, or at least any detrimental effect is acceptable.

In embodiment, the substrate holder WH is circular in plan and the burls are arranged in concentric rings. Some burls may be arranged not in the concentric rings, e.g. in the vicinity of through-holes 89 in the substrate holder WH. The edge seal 85 is also annular and concentric with the rings of burls. The second group of burls 20b may be the outermost ring. The width D of the gap is determined relative to the radial distance P between the innermost ring of the second group and the next ring (i.e. the outermost ring of the first group).

In embodiment in which the burls are not arranged in concentric rings, the gap width is desirably determined relative to the average (e.g. the mean, mode or median) pitch of the burls of the first group. The pitch is defined as the center-to-center distance of adjacent burls. In most cases the pitch of the burls will be uniform across the substrate holder WH. However, sometimes there may be variation, e.g. in the vicinity of other features of the substrate holder WH such as holes for e-pins or vacuum ports. Where there is variation in the pitch of the burls, the mean, mode and median are likely to be very similar.

In an embodiment in which the burls are not arranged in concentric rings, the second group of burls consists of those burls that are within a distance from the edge seal of less than the average pitch.

The person skilled in the art will understand that the vertical stiffness of a burl is the ratio of the magnitude of vertical compressive force applied to its distal end to the amount of compression (change in height as a proportion of original height) that results. The area stiffness (stiffness per unit area) of a collection of burls is determined by the stiffness of the individual burls and the density of the burls (number of burls per unit area). In an embodiment of the invention either or both the stiffness of individual burls or the density of the burls may be varied in the second group compared to the first group. In an embodiment where the second group of burls consists of the single outermost ring of burls, the density of the second group of burls 20*b* is determined by the circumferential spacing of the burls.

The stiffness of individual burls can be varied by various means, e.g. by varying their cross-sectional area, by varying their shape (e.g. more or less tapered) or by varying their composition.

The gap width D is at least 75% of the pitch and desirably at least 80% of the pitch P. The gap width D is desirably at least 90% of the pitch P. In an embodiment it is about 100% of the pitch P. It is believed that a wider gap is capable of holding substrates with a greater amount of warpage. Desirably, the gap width D is no more than 125% of the pitch P.

In an embodiment the vertical stiffness per unit area of the second group of burls 20*b* is at least 150% of that of the first group and desirably at least 160% of that of the first group. In an embodiment the vertical stiffness per unit area of the second group of burls 20*b* is at least 180% of that of the first group. In an embodiment the vertical stiffness per unit area of the second group of burls 20*b* is not more than 200% of that of the first group.

Figure 4:
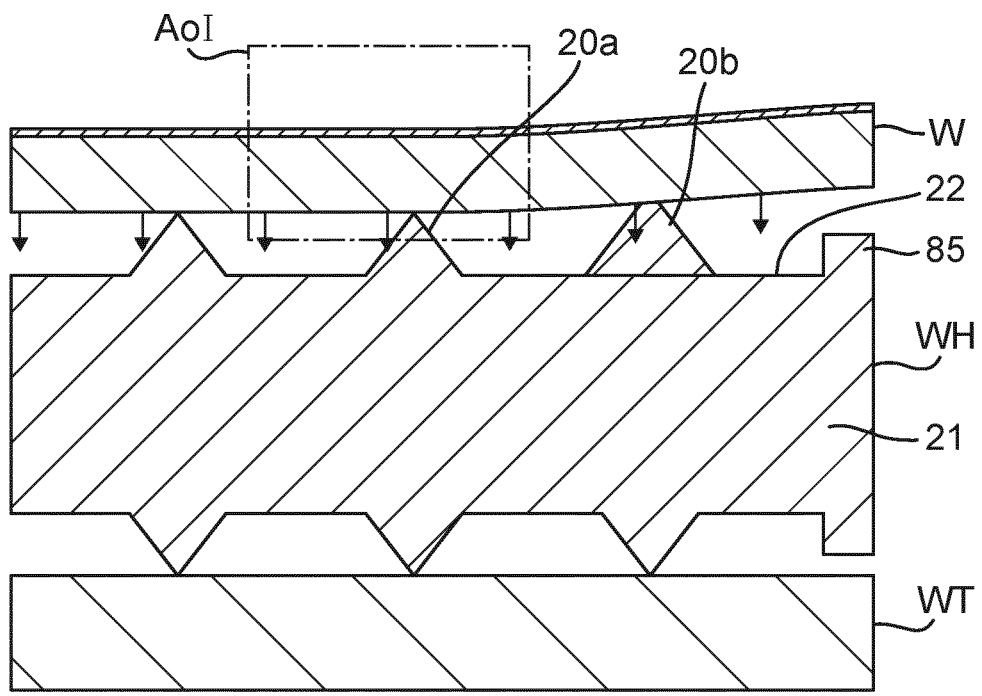
FIG. 4 depicts part of a substrate holder according to an embodiment of the present invention clamping a bowl-shaped substrate.
Figure 5:
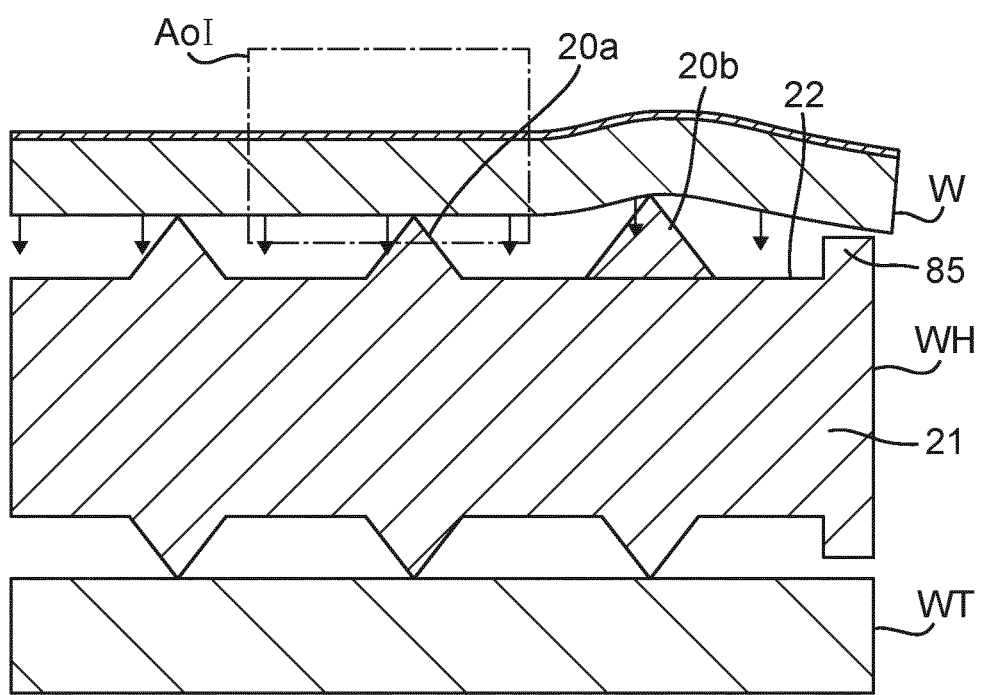
FIG. 5 depicts part of the substrate holder according to an embodiment of the present invention clamping an umbrella-shaped substrate.
Figure 6:
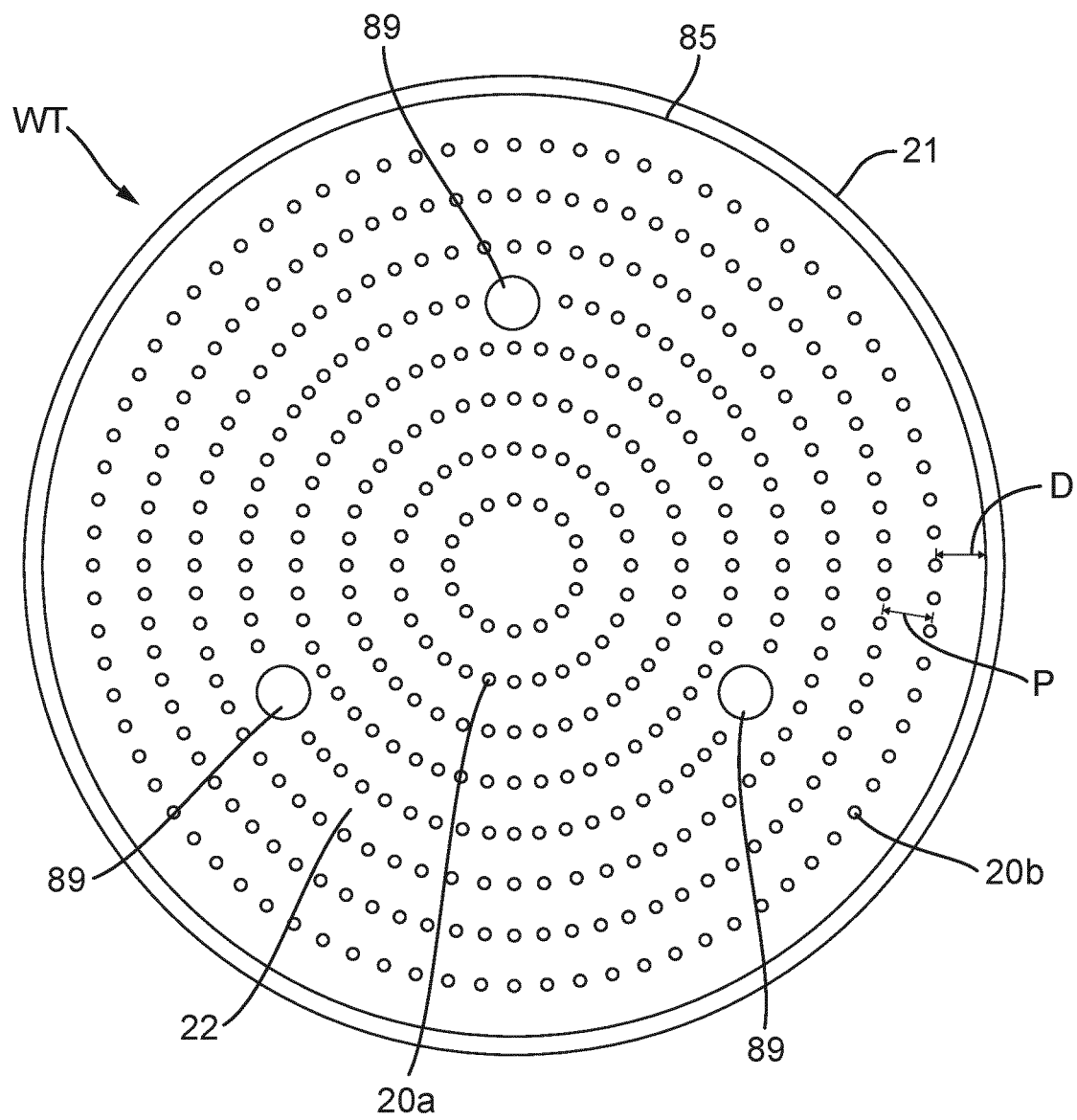
FIG. 6 depicts the substrate holder of FIGS. 4 and 5 in plan.

A part of a substrate holder WH according to an embodiment is shown in cross-section in FIGS. 4 and 5. In FIG. 4 the substrate holder WH is shown clamping a bowl-shaped substrate; in FIG. 5 it is shown clamping an umbrella-shaped substrate. As with FIGS. 2 and 3, the distortion of the substrates W is greatly exaggerated in FIGS. 4 and 5. In FIGS. 4 and 5 the outer burl 20*b* is indicated with a different hatching and shown as larger than other burls only to help distinguish it visually form other burls; this should not be taken as indicating that the outer burl 20*b* must be of a different material or size than the other burls. The whole substrate holder WH is shown in plan in FIG. 6. In FIG. 6, the size of the burls is exaggerated and the number much reduced for the sake of clarity.

Substrate holder WH is mounted on substrate support WT. Substrate holder WH comprises a main body 21 having a main body upper surface 22 and a plurality of burls 20 projecting from the main body upper surface 22. A substrate W can be supported by the distal end surfaces of burls 20, which conform to a substantially flat support plane to support the substrate W in a flat state. Main body 21 and burls 20 may be formed of SiSiC, a ceramic material having silicon carbide (SiC) grains in a silicon matrix. Burls 20 may be integral with main body 21 and formed by additive or subtractive techniques. Alternatively burls 20 may be deposited on main body 21 and can be formed of a different material than main body 21. Burls 20*b* of the second group may be formed using a different technique and/or different materials than the burls 20*a* of the first group. Suitable materials and techniques for manufacturing the substrate holder WH are known in the art.

A plurality of through-holes 89 are formed in the main body 21. Through-holes 89 allow the e-pins to project through the substrate holder WH to receive the substrate W and allow the space between the substrate W and the substrate holder WH to be evacuated. Separate through-holes for evacuating the space between substrate W and substrate holder WH can also be provided. Evacuation of the space between the substrate W and the substrate holder WH can provide a clamping force to hold the substrate W in place by creating a pressure difference with the space above the substrate W. In a lithographic apparatus using EUV radiation the space above the substrate W is at a low pressure so that an adequate pressure differential cannot be created. Therefore, electrodes can be provided on the substrate holder WH to form an electrostatic clamp. Other structures, e.g. to control gas flow and/or thermal conductivity between the substrate holder WH and the substrate W, can be provided. The substrate holder WH can also be provided with electronic components, e.g. heaters and sensors, to control the temperature of the substrate holder WH and substrate W.

An edge seal 85 is provided near the periphery of substrate holder WH. Edge seal 85 is a projecting ridge around the outside of substrate holder WH. It has a height slightly shorter than that of the burls 20 so that it does not contact an undistorted substrate W but reduces the gas flow into the space between the substrate W and substrate holder WH so as to improve vacuum clamping. When vacuum clamping is applied, the pressure of the gas outside the edge seal 85 will be greater than the pressure of gas inside it. If the diameter of the edge seal 85 is less than that of the substrate W those parts of the substrate W that are radially outward of the edge seal will 85 experience no clamping force, or a reduced clamping force compared to those parts inward of the edge seal 85.

In an embodiment, burls 20 have a height in the range of from 100 μm to 500 μm, e.g. about 150 μm. The diameter of the distal end surface of burls 20 may be in the range of 100 μm to 500 μm, e.g. about 200 μm, 210 μm, 270 μm or 350 μm. The pitch of the burls 20, i.e. the distance between the centers of two adjacent burls 20, may be in the range of about 0.5 mm to 3 mm, e.g. about 1.5 mm, 2 mm or 2.5 mm. In an embodiment, the total area of the distal end surfaces of all the burls 20 is in the range of from 1% to 3% of the total area of a substrate W or the substrate holder WH. Burls 20 may be frusto-conical in shape, with side walls that are slightly inclined. In an embodiment, the side walls may be vertical or even overhanging if that is more convenient to manufacture. In an embodiment burls 20 are circular in plan. Burls 20 can also be formed in other shapes if desired.

In an embodiment, one or more coatings may be applied to all or parts of the burls 20 to control properties thereof, such as the friction between the burls 20 and the substrate W. For example, a layer of diamond-like carbon (DLC) can be provided on distal end surface of burls 20 to form a release structure.

Figure 7:
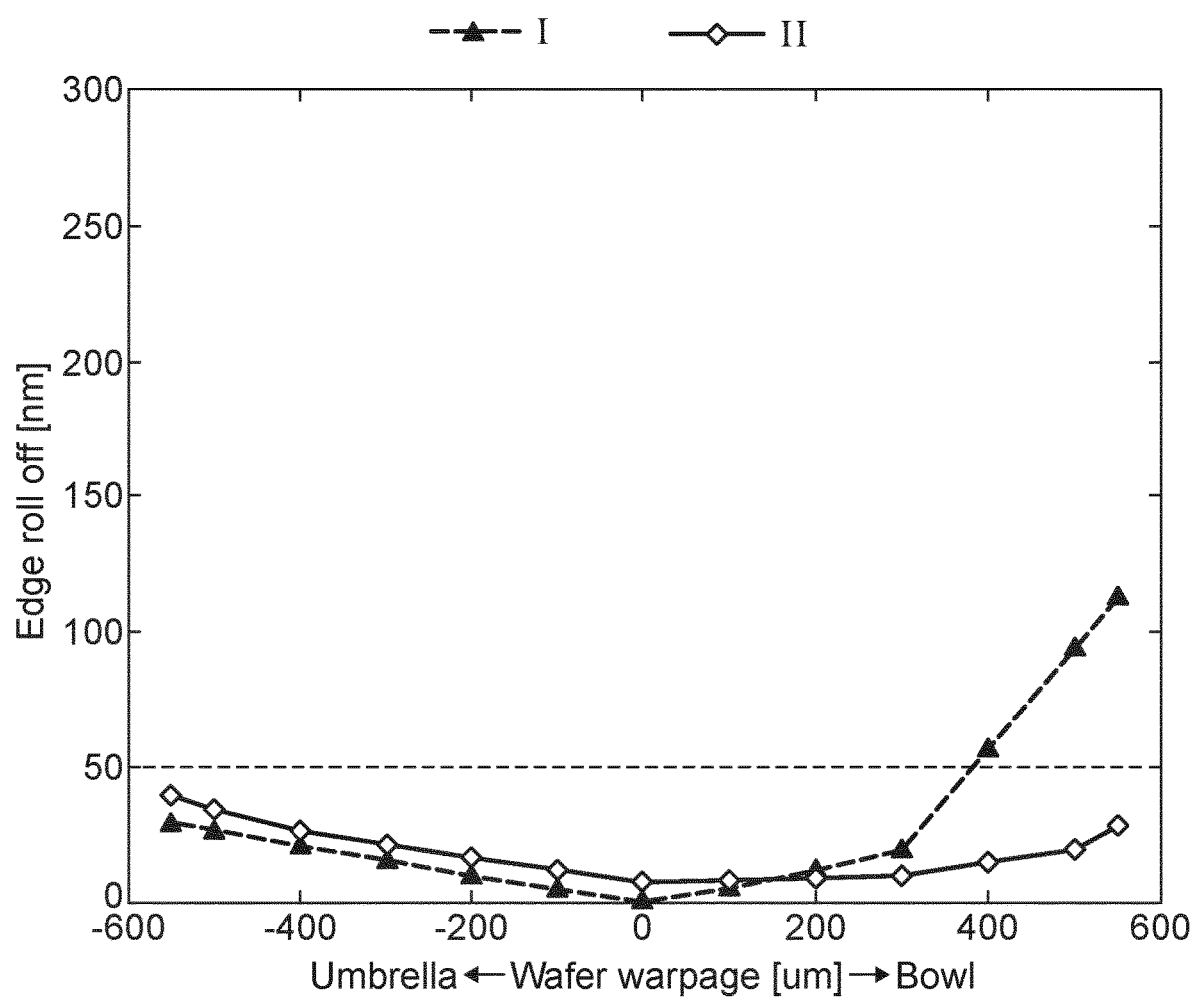
FIG. 7 is a graph showing results of finite element analysis of the effect of clamping substrates with various amounts of warp on conventional substrate holders and substrate holders according to embodiments of the present invention.

FIG. 7 depicts the results of FEM simulations of the clamping of substrates W of different amounts of warpage by different designs of substrate holder WH. The horizontal axis indicates the amount of warpage (peak to valley) in μm of the unloaded substrate whilst the vertical axis indicates the height variation in nm from the average height of the substrate W at the area of interest AoI, in this case at 3 mm from the edge of a 300 mm substrate. Solid triangles (I) depict results from a substrate holder having a gap between the outermost ring of burls and the edge seal of less than 75% of the pitch and all burls having the same stiffness and density. Open diamonds (II) depict results of a substrate holder similar to that of example I but also having burls and edge seal arranged in accordance with an embodiment of the invention.

It will be seen that the substrate holder of example I performs well with umbrella-shaped wafer but less well with bowl shaped wafers. The embodiment of the invention, holder II, on the other hand provides a very substantial improvement in performance with bowl-shaped wafers but with no significant deterioration in performance with umbrella-shaped substrates. It will be seen that an embodiment of the invention is able to hold a wider range of substrates than an equivalent substrate holder not according to the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A substrate holder for use in a lithographic apparatus and configured to support a substrate, the substrate holder comprising:
a main body having a main body surface;
a plurality of burls projecting from the main body surface and each having a distal end surface which substantially conforms to a support plane and is configured for supporting the substrate; and
an edge seal projecting from the main body surface and extending around the plurality of burls so as to restrict gas flow when a substrate is held by the substrate holder; wherein:
the edge seal is spaced apart from the plurality of burls so as to define a gap between the edge seal and the plurality of burls, the gap having a gap width that is greater than or equal to about 75% of a pitch of the plurality of burls;
the plurality of burls comprises a first group of burls and a second group of burls, the second group of burls surrounding the first group of burls; and
the stiffness in a direction perpendicular to the support plane per unit area of the second group of burls is greater than or equal to about 150% of the stiffness in the direction perpendicular to the support plane per unit area of the first group of burls.

2. The substrate holder according to claim 1, wherein the gap width is greater than or equal to about 80% of the pitch of the plurality of burls.

3. The substrate holder according to claim 1, wherein the gap width is less than or equal to about 125% of the pitch of the plurality of burls.

4. The substrate holder according to claim 1, wherein the stiffness in the direction perpendicular to the support plane per unit area of the second group of burls is greater than or equal to about 160% of the stiffness in the direction perpendicular to the support plane per unit area of the first group of burls.

5. The substrate holder according to claim 1, wherein the stiffness in the direction perpendicular to the support plane per unit area of the second group of burls is less than or equal to about 200% of the stiffness in the direction perpendicular to the support plane per unit area of the first group of burls.

6. The substrate holder according to claim 1, wherein the stiffness in the direction perpendicular to the support plane of each of the burls of the second group of burls is greater than the average stiffness in the direction perpendicular to the support plane of the burls of the first group.

7. The substrate holder according to claim 1, wherein the density of the second group of burls is greater than the density of the first group of burls.

8. The substrate holder according to claim 1, wherein each burl of the second group of burls has a cross-sectional area in a plane parallel to the support plane that is larger than the cross-section of each burl of the first group of burls.

9. The substrate holder according to claim 1, wherein the second group of burls and at least some of the first group of burls are arranged in concentric rings of which some of the burls forms an outermost ring.

10. The substrate holder according to claim 9, wherein the pitch is the spacing between the second group of burls and the outermost ring of burls amongst the first group of burls.

11. A lithographic apparatus for applying a pattern to a substrate, the lithographic apparatus comprising the substrate holder according to claim 1.

12. A device manufacturing method comprising:
holding a substrate on the substrate holder according to claim 1 by reducing pressure between the main body surface and the substrate; and
applying a pattern to the substrate.

13. A substrate holder for use in a lithographic apparatus and configured to support a substrate, the substrate holder comprising:
a main body having a main body surface;
a plurality of burls projecting from the main body surface and each having a distal end surface which substantially conforms to a support plane and is configured for supporting the substrate; and
an edge seal projecting from the main body surface and extending around the plurality of burls so as to restrict gas flow when a substrate is held by the substrate holder; wherein:
the edge seal is spaced apart from the plurality of burls so as to define a gap between the edge seal and the plurality of burls, the gap having a gap width that is greater than or equal to about 75% of a pitch of the plurality of burls;
the plurality of burls comprises a first group of burls and a second group of burls, the second group of burls nearer the edge seal than the first group of burls; and
the density of the second group of burls is greater than the density of the first group of burls.

14. The substrate holder according to claim 13, wherein the gap width is greater than or equal to about 80% of the pitch of the plurality of burls.

15. The substrate holder according to claim 14, wherein the gap width is less than or equal to about 125% of the pitch of the plurality of burls.

16. The substrate holder according to claim 13, wherein the stiffness in a direction perpendicular to the support plane per unit area of the second group of burls is greater than the stiffness in the direction perpendicular to the support plane per unit area of the first group of burls.

17. The substrate holder according to claim 16, wherein the stiffness in the direction perpendicular to the support plane per unit area of the second group of burls is greater than or equal to about 160%, and less than or equal to about 200%, of the stiffness in the direction perpendicular to the support plane per unit area of the first group of burls.

18. The substrate holder according to claim 13, wherein the stiffness in the direction perpendicular to the support plane of each of the burls of the second group of burls is greater than the average stiffness in the direction perpendicular to the support plane of the burls of the first group.

19. The substrate holder according to claim 13, wherein each burl of the second group of burls has a cross-sectional area in a plane parallel to the support plane that is larger than the cross-section of each burl of the first group of burls.

20. A lithographic apparatus for applying a pattern to a substrate, the lithographic apparatus comprising the substrate holder according to claim 13.

* * * * *